United States Patent
Grodzki (10) Patent No.: US 9,223,000 B2
(45) Date of Patent: Dec. 29, 2015

(54) MAGNETIC RESONANCE SYSTEM, OPERATING METHOD AND CONTROL DEVICE TO GENERATE $T_2$-WEIGHTED IMAGES USING A PULSE SEQUENCE WITH VERY SHORT ECHO TIMES

(71) Applicant: David Grodzki, Erlangen (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 546 days.

(21) Appl. No.: 13/627,034

(22) Filed: Sep. 26, 2012

(65) Prior Publication Data

US 2013/0169273 A1    Jul. 4, 2013

(30) Foreign Application Priority Data

Sep. 26, 2011    (DE) .......................... 10 2011 083 398

(51) Int. Cl.
 *G01R 33/54*    (2006.01)
 *G01R 33/48*    (2006.01)
 *G01R 33/56*    (2006.01)

(52) U.S. Cl.
 CPC ............ *G01R 33/54* (2013.01); *G01R 33/4816* (2013.01); *G01R 33/5602* (2013.01)

(58) Field of Classification Search
 CPC . G01R 33/54; G01R 33/5602; G01R 33/4816
 See application file for complete search history.

(56) References Cited

U.S. PATENT DOCUMENTS

| | | | | |
|---|---|---|---|---|
| 5,914,599 | A * | 6/1999 | Sharp | 324/318 |
| 6,049,206 | A * | 4/2000 | Sharp | 324/314 |
| 6,570,381 | B1 * | 5/2003 | Speier et al. | 324/303 |
| 6,597,170 | B1 * | 7/2003 | Beard et al. | 324/303 |
| 8,093,895 | B2 * | 1/2012 | Umeda | 324/307 |
| 8,723,516 | B2 * | 5/2014 | Wheaton et al. | 324/307 |
| 8,779,767 | B2 * | 7/2014 | Umeda | 324/307 |
| 2009/0058418 | A1 | 3/2009 | Josan et al. | |

OTHER PUBLICATIONS

S.D. Beyea et al., "Imaging of Heterageneous Materials with a Turbo Spin Echo Single-Point Imaging technique", J. Magn. Reson. 144 (2000), pp. 255-265.

(Continued)

*Primary Examiner* — Dixomara Vargas
(74) *Attorney, Agent, or Firm* — Schiff Hardin LLP (57) ABSTRACT

In a method to control a magnetic resonance system to generate magnetic resonance exposures of an examination subject, a first magnetic resonance radio-frequency pulse with a pulse length of at most 50 μs is initially emitted in a volume region of the examination subject. At least one second magnetic resonance radio-frequency pulse, whose phase is essentially rotated by 180° relative to the first magnetic resonance radio-frequency pulse, with a pulse length of at most 50 μs, is emitted in the same volume region of the examination subject in a predetermined time interval immediately after the first magnetic resonance radio-frequency pulse. An acquisition of raw data from the volume region of the examination subject then takes place. Furthermore, a control device for operating a magnetic resonance system as well as a magnetic resonance system with such a control device to implement such a method, are described.

19 Claims, 5 Drawing Sheets

(56) References Cited

OTHER PUBLICATIONS

Liu et al., "Ultrashort T*2 Relaxometry for Quantitation of Highly Concentrated Superparamagnetic Iron Oxide (SPIO) Nanoparticle Labeled Cells," Magnetic Resonance in Medicine, vol. 61 (2009), pp. 761-766.

Carl et al., "Radiofrequency Pulses for Simultaneous Short T2 Excitation and Long T2 Suppression," Magnetic Resonance in Medicine, vol. 65 (2011), pp. 531-537.

Brittain et al., "Coronary Angiography with Magnetization-Prepared T2 Contrast," Magnetic Resonance in Medicine, vol. 33 (1995), pp. 689-696.

Ropele at al., "Measurement of Short and Ultrashort T2 Components Using Progressive Binomial RF Saturation," Magnetic Resonance in Medicine, vol. 56 (2006), pp. 265-271.

* cited by examiner

MAGNETIC RESONANCE SYSTEM, OPERATING METHOD AND CONTROL DEVICE TO GENERATE $T_2$-WEIGHTED IMAGES USING A PULSE SEQUENCE WITH VERY SHORT ECHO TIMES

BACKGROUND OF THE INVENTION

1. Field of the Invention

The present invention concerns a method to control a magnetic resonance system to generate magnetic resonance exposures of an examination subject, as well as a control device for a magnetic resonance system and a magnetic resonance system with which such a method can be implemented.

2. Description of the Prior Art

In order to obtain magnetic resonance exposures—i.e. image data—from a region of the inside of a body of an examination subject, the body or the body part that is to be examined, must initially be exposed to an optimally homogeneous, static basic magnetic field (most often designated as a $B_0$ field). The nuclear spins in the body are thereby aligned parallel to the direction of the $B_0$ field (typically designated as the z-direction). Moreover, radio-frequency pulses (also called "magnetic resonance radio-frequency pulses" in the following) are radiated into the examination subject with radio-frequency antennas. The frequency of the radio-frequency pulses is in the range of the resonance frequency (known as the Larmor frequency) of the nuclei to be excited (normally hydrogen nuclei) in the present magnetic field. The magnetic flux density of these radio-frequency pulses is typically designated with $B_1$. By means of these radio-frequency pulses, the nuclear spins of the atoms in the examination subject are excited such that they are deflected by what is known as an "excitation flip angle" (also generally abbreviated to "flip angle" in the following) out of their steady state, parallel to the basic magnetic field $B_0$. The relationship between the field strength $B_1$ and the flip angle $\alpha$ that is achieved with this is provided by the equation $$\alpha = \int_{t=0}^{T} \gamma \cdot B_1(t) \cdot dt, \qquad (1)$$

wherein $\gamma$ is the gyromagnetic ratio which—for most magnetic resonance examinations—can be considered as a fixed material constant, and T is the active duration of the radio-frequency pulse. The nuclear spins then initially precess around the z-direction and relax again bit by bit. The rotation of the nuclear spins around the precession cone can be viewed as a macroscopic nuclear magnetization in the x/y-plane (perpendicular to the z-direction). The magnetic resonance signals generated in the relaxation are acquired as raw data by means of radio-frequency reception antennas, and ultimately the magnetic resonance images are reconstructed on the basis of the acquired raw data. The spatial coding takes place with the use of rapidly switched gradient magnetic fields that are superimposed on the basic magnetic field during the emission of the magnetic resonance radio-frequency pulses and/or the acquisition of the raw data.

For the relaxation, the excited nuclei require a characteristic decay time that is dependent on the chemical bond and the molecular environment in which the excited nucleus is found. The different tissue types therefore characteristically differ in their signal, which leads to varying signal strengths (brightnesses) in the resulting image. Differentiation is made between two different characteristic relaxation times, the longitudinal relaxation time $T_1$ and the transverse relaxation time $T_2$. The longitudinal relaxation time $T_1$ is determined by interaction with the surrounding atoms in the lattice. The transverse magnetization MT decays due to what is known as spin-spin interaction with adjacent atoms with continuing time t after the end of the magnetic resonance radio-frequency pulse, according to the equation:

$$MT(t) = MT(0) \cdot e^{\frac{t}{T_2}} \qquad (2)$$

Figure 1:
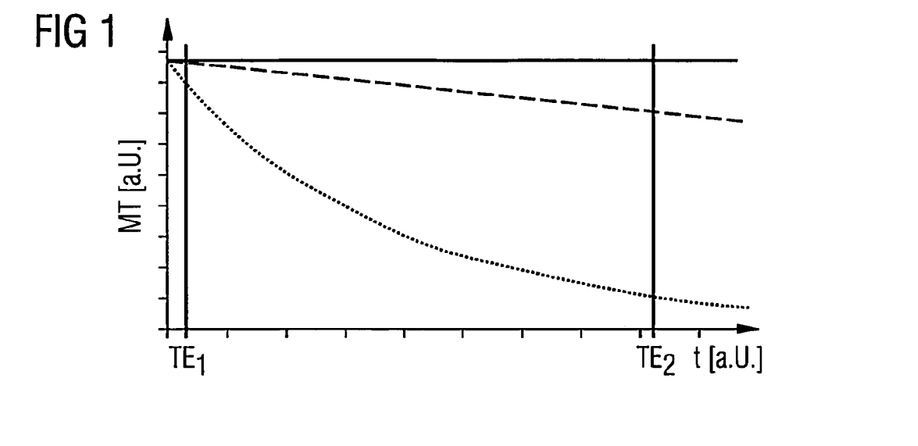
FIG. 1 schematically shows the time decay of the transverse magnetization of substances depending on their $T_2$ time constant.

This temporal response is schematically presented in FIG. 1 (in arbitrary units=a.U.) for three substances with differing transversal relaxation times or, respectively, $T_2$ time constants. The solid curve corresponds to a substance with long $T_2$; the dashed curve corresponds to a substance with medium $T_2$; and the dotted curve corresponds to a substance with very short $T_2$. The $T_2$ time constant (also abbreviated only as "$T_2$" in the following) is very different for different substances. While this time constant is relatively long for some tissue types and fluids (up to 100 ms or more), for bones, teeth or ice it is only between 30 µs and 80 µs, for example.

In the case of specific diagnostic questions (for example in orthopedic applications), images that show only substances with short $T_2$ are required for monitoring of cryo-ablations or for MR-PET or PET attenuation correction. To create an image in which only substances with short $T_2$ are visible, substances with long $T_2$ could be saturated via very long (~50 ms) pre-pulses. Alternatively, a second echo with longer echo time and a difference image made of first and second echo could be generated.

Furthermore, sequences with very short echo times—known as UEZ sequences (UEZ=ultra-short echo times with TE<0.5 ms)—enable the presentation of substances with short $T_2$ that are not visible with conventional sequences. Examples of UEZ sequences are UTE (Ultra Short Echo Time), PETRA (Pointwise Encoding Time Reduction with Radial Acquisition) or z-TE (Zero Echo Time). In these sequences, for the most part a hard δ-pulse is applied and after this a data acquisition is begun in free induction decay (FID). However, since given very short times the signals of all substances decay approximately equally (see echo time $TE_1$ in FIG. 1), no $T_2$ contrast can be generated with these. Only with longer times (see echo time $TE_2$ in FIG. 1) does a larger difference exist between the individual substances, and the image is $T_2$-weighted. However, at these times it is precisely the substances with short transversal relaxation times $T_2$ that have already significantly decayed. The contrast in UEZ sequences is therefore limited to $T_1$ or PD contrast (PD=proton density), wherein the contrast from the steady state (after the transient process) of the measurement is provided and depends on the flip angle and the repetition time. In particular, with the present UEZ sequences it is consequently also not possible to generate $T_2$ contrasts in which substances with long $T_2$ are markedly brighter in the image than substances with short $T_2$, as they are required for many clinical questions.

SUMMARY OF THE INVENTION

An object of the present invention is to provide a method to control a magnetic resonance system to generate $T_2$-weighted magnetic resonance exposures with UEZ sequences, as well as a control device for a magnetic resonance system that is suitable for this.

In a method according to the invention to control a magnetic resonance system to generate magnetic resonance exposures of an examination subject, a first magnetic resonance radio-frequency pulse with a pulse length of a maximum of 50 µs is initially emitted into a volume region of the examination subject. As this is typical in UEZ sequences, this is preferably a hard δ-pulse that is not frequency-selective due to the extremely short pulse length. However, the emission of a second magnetic resonance radio-frequency pulse whose phase is essentially rotated by 180° relative to the first magnetic resonance radio-frequency pulse then takes place (again with a pulse length of at most 50 µs) in the same volume region of the examination subject in a predetermined time interval (i.e. a time interval that is predeterminable by the operator, for example) immediately after the first magnetic resonance radio-frequency pulse. This is again also advantageously a hard δ-pulse that is not frequency-selective due to the extremely short pulse length. In the sense of the invention, "essentially rotated by 180°" means that this pulse predominantly counteracts the effect of the previous pulse.

The acquisition of raw data—i.e. the acquisition of magnetic resonance signals in FID, i.e. without special induction of an echo—from the volume region of the examination subject then takes only after these at least two pulses. The desired $T_2$-weighted magnetic resonance exposures can then be reconstructed on the basis of these raw data.

Because of the short pulse lengths and the relatively short time period between the pulses, use can be made of the fact that the transverse magnetization of substances with short $T_2$ varies relatively quickly and strongly, in contrast to which substances with long $T_2$ barely change between the pulses. It is thus possible to discriminate these substances from one another, in particular by suitable selection of the pulse intervals of the ultra-short pulses from one another, and thus also to generate $T_2$-weighted magnetic resonance exposures with UEZ sequences. The exact manner by which this discrimination takes place depends on the concrete pulse sequence. In the following it is further explained that $T_2$-weighted magnetic resonance exposures with only substances with short $T_2$ times—as this would be desirable for imaging of bones, teeth or ice, for example—can be generated by (for example) a direct acquisition of raw data after only two pulses. In contrast to this, if another third, shorter pulse is radiated before the acquisition of raw data, $T_2$-weighted magnetic resonance exposures, in which substances with long $T_2$ are markedly brighter in the image than substances with short $T_2$, can also be generated with a UEZ sequence.

$T_2$-weighted magnetic resonance exposures of substances with extremely short $T_2$ are thus possible, wherein substances with longer $T_2$ are suppressed quickly and effectively. The method is thereby time-saving as a UEZ sequence. Moreover, substances with short $T_2$ sequence can also be selectively suppressed quickly and effectively depending on the embodiment of the concrete sequence. In this case, additional advantages are the only slight influence of susceptibility changes (in particular in the environment of air or metal), such that lesser susceptibility artifacts arise than in conventional exposures, and possibly $T_2$-weighted magnetic resonance exposures in the region of artificial hip joints can even be produced with the method according to the invention.

Among other things, a control device according to the invention for a magnetic resonance system requires the following components.

A radio-frequency transmission device is required to send magnetic resonance radio-frequency pulse signals to a transmission antenna system of the magnetic resonance system. For example, this transmission antenna system can be a typical body coil arranged around a measurement space for the patient in the scanner (data acquisition unit) or a local coil system with a number of local coils positioned on or under the patient. The radio-frequency transmission device includes a number of components, among other things small signal generators that ensure that the matching radio-frequency pulses are initially generated with lower amplitude, and suitable radio-frequency power amplifiers in order to feed the radio-frequency pulses with the required power into the antennas. Also among these components are monitoring components with which it is ensured that the radio-frequency power lies within the limit values provided by the SAR (Specific Absorption Rate) standards, etc.

Furthermore, the control device requires a gradient system interface to control a gradient system of the magnetic resonance system to generate the gradient magnetic fields. This means that a suitable interface is required with which gradient pulses are generated and then fed into the various gradient coils of the gradient system.

In addition, a radio-frequency reception device is required to receive (detect) raw data via a reception antenna system of the magnetic resonance system. This reception antenna system can be the same system as the transmission antenna system if this can be accordingly switched between a transmission mode and a reception mode. Normally, this reception antenna system is formed by suitable local coils. The radio-frequency reception device accordingly has a number of acquisition channels in which the signals captured by the individual antennas of the reception antenna system are accepted and processed further (in particular are amplified and digitized).

Finally, the control device requires a sequence control unit that—to generate magnetic resonance exposures of an examination subject—during generation transmits sequence control data to the radio-frequency transmission device, the gradient system interface and the radio-frequency reception device so that (at least as described above) a first magnetic resonance radio-frequency pulse with a pulse length of at most 50 µs is emitted in a volume region of the examination subject. Thereafter, in a time interval after the first magnetic resonance radio-frequency pulse, a second magnetic resonance radio-frequency pulse is emitted into the same volume region of the examination subject, with phase rotated by essentially 180° relative to the first magnetic resonance radio-frequency pulse and with a pulse length of at most 50 µs. Immediately after the second pulse or after additional, corresponding short pulses raw data are acquired from the volume region of the examination subject.

In addition to a basic field magnet system with which a basic magnetic field is applied in a typical manner in the patient measurement space, a magnetic resonance system according to the invention must include a transmission antenna system as described above, a gradient system having multiple gradient coils, and a control device according to the invention that is described above.

The sequence control unit can preferably be realized in the form of software on a suitable programmable control device with corresponding memory capabilities. The radio-frequency transmission device, the gradient system interface and the radio-frequency reception device can be at least partially realized in the form of software units, with other units of these components are being purely hardware units, for example the radio-frequency amplifier, a gradient pulse generation device of the gradient system interface, or an analog/digital converter of the radio-frequency reception device etc. A realization largely in software, in particular of the sequence control unit, has the advantage that magnetic resonance system control devices that have already previously been in use can be retrofitted in a simple manner via a software update in order to operate in the manner according to the invention. The above object also can be achieved by computer-readable instructions/commands stored in a transportable storage medium and/or provided for transmission via a network, that can be loaded directly into a memory of a programmable magnetic resonance system control device, with program segments in order to execute all steps of the method according to the invention when the program is executed in the control device.

As noted above, in a preferred embodiment of the method according to the invention the second magnetic resonance radio-frequency pulse is already used as an excitation pulse, and the acquisition of raw data takes place in a short time interval immediately after emission of the second magnetic resonance radio-frequency pulse. As used herein a "short time interval" means a time period that is so short that the transverse magnetization of even substances with short $T_2$ has not yet fallen too sharply, such that sufficient signal of even these substances is captured in the FID and the substances contribute to the contrast. The interval between the last magnetic resonance radio-frequency pulse and the beginning of the acquisition of raw data is advantageously at most 200 μs, preferably 100 μs. It preferably amounts to at least 50 μs, more preferably approximately 70 μs (for example with a tolerance of 2 μs above and below). The interval is calculated from the middle of the pulse to the beginning of the data acquisition.

In this method, another hard excitation pulse is thus initially applied at a defined point in time before the subsequent hard excitation pulse, and the effects of the two pulses are counter to one another. This leads overall to the situation that all substances are excited by the first pulse, but then the transverse magnetization of substances with short $T_2$ is strongly relaxed between the pulses, in contrast to which the transverse magnetization of substances with long $T_2$ barely changes between the pulses. The flip angles of the substances with long $T_2$ are consequently flipped back again to zero by the second pulse, in contrast to which the substances with short $T_2$ are newly excited. If the raw data are then acquired in FID in a short interval after this, only the substances with short $T_2$ have a transverse magnetization differing from zero and are therefore visible in the image. Substances with long $T_2$ are thus suppressed quickly and well in a simple manner.

The interval between the first magnetic resonance radio-frequency pulse and the second magnetic resonance radio-frequency pulse in this method variant preferably amounts to at most 1000 μs, particularly preferably at most 500 μs, more preferably at most 200 μs. In general, it preferably amounts to at least 100 μs. The interval between two pulses is calculated from pulse middle-to-pulse middle within the framework of the invention.

In an alternative preferred variant, a third magnetic resonance radio-frequency pulse with a pulse length of at most 50 μs and whose phase is rotated by essentially 180° relative to the second magnetic resonance radio-frequency pulse is emitted as an excitation pulse in the same volume region of the examination subject in a predetermined short time interval (i.e. a short time interval that can be predetermined by the operator) immediately after the second magnetic resonance radio-frequency pulse, as was likewise mentioned above. This pulse is again advantageously a hard δ-pulse that is not frequency-selective due to the extremely short pulse length. In this variant, the acquisition of raw data takes place in a short time interval immediately after emission of the third magnetic resonance radio-frequency pulse.

As used herein a "short time interval" between the second and third pulse or between the third pulse and the raw data acquisition again means a time period that is so short that even the transversal magnetization of the substances with short $T_2$ has not yet declined too significantly. Here this means that the interval between the last magnetic resonance radio-frequency pulse and the beginning of the acquisition of raw data amounts to at most 200 μs, preferably approximately 70 μs. The interval between the second magnetic resonance radio-frequency pulse and the third magnetic resonance radio-frequency pulse preferably amounts to at most 1000 μs, more preferably at most 500 μs and most preferably at most 200 μs. In general, it preferably amounts to at least 100 μs.

In this alternative of the method according to the invention, a saturation of substances with short $T_2$ is thus produced in order to achieve a $T_2$ contrast in the image data with a UEZ sequence. A first hard pulse is thereby applied at a first time, as in the first variant of the method according to the invention. In this second method variant, the pulse interval between the first and second pulses should be longer than the interval in the first method variant. It preferably amounts to more than 2 ms, more preferably more than 5 ms.

The interval between the second and third pulses of the second variant is approximately equal to the interval of the two pulses in the first method variant. In both method variants, the interval between the penultimate pulse and the last pulse (before the data acquisition) lies in the same order of magnitude. The transverse magnetization of substances with short $T_2$ relaxes in this time period. These substances are then re-excited with the second pulse, the phase of which is shifted by 180° relative to the first pulse and the excitation pulse. Since the transverse magnetization of substances with long $T_2$ barely changes in the time between the pulses, as in the first variant these are flipped back to zero by the second pulse. However, if the data acquisition is not then immediately started (which is different than in the first variant), but rather the third hard pulse is emitted in a short interval, the transverse magnetization of substances with short $T_2$ is again rotated to zero and only substances with longer $T_2$ deliver a significant signal in the image. Measurements of $T_2$-weighted magnetic resonance exposures with FID-based methods (in particular the desired UEZ sequences) are possible in this way.

It is not necessary to achieve a strong flip angle excitation (for example of 90° or more) with each of the pulses, which is different than with known methods. Instead, the first and/or second and/or third magnetic resonance radio-frequency pulse is advantageously what is known as a "small angle pulse" with which a magnetization with a mean flip angle of at most 15° (preferably at most 10°, more preferably approximately 5°) is generated. As used herein the average flip angle is the mean nuclear magnetization in the excited volume.

The operation with such small angle pulses allows the pulse lengths of the first and/or second and/or third magnetic resonance radio-frequency pulse to be extremely severely shortened. This pulse length advantageously amounts to at most 30 μs, more preferably between 10 μs and 20 μs, most preferably approximately 15 μs (for example with a deviation above and below of at most 2 μs). These pulse lengths allow the intervals between the actual excitation pulse and the data acquisition, or between the second and third pulse to be made extremely short, and thus to utilize the method well even given substances with particularly short $T_2$.

Due to the short pulse length, as mentioned above these hard magnetic resonance radio-frequency pulses are not frequency-selective. Inasmuch these are also not slice-selective pulses. Therefore, the magnetic resonance radio-frequency pulses are advantageously emitted without simultaneous emission of gradient pulses. Alternatively, it would be possible to emit gradient pulses in parallel with the magnetic resonance radio-frequency pulses, wherein then however it would reasonably be ensured that the gradient moment is compensated again overall over the various magnetic resonance radio-frequency pulses. This means that (for example given a pulse sequence with only two magnetic resonance radio-frequency pulses) given each of the magnetic resonance radio-frequency pulses a gradient pulse of the same strength but with different algebraic sign is emitted.

In both variants it is possible for the magnetic resonance radio-frequency pulses to be selected so that the same mean flip angle is respectively generated with them, meaning that the pulses are emitted with the same intensity and length, for example. This method is particularly simple.

In principle, however, in a preferred embodiment it is also possible for different mean flip angles to be generated with at least two of the magnetic resonance radio-frequency pulses. As is explained in detail below, certain substances with defined $T_2$ time constants can be suppressed by different flip angle excitations via the different magnetic resonance radio-frequency pulses in the sequence.

DESCRIPTION OF THE PREFERRED EMBODIMENTS

The contents of FIG. 1 has already been explained above.

Figure 2:
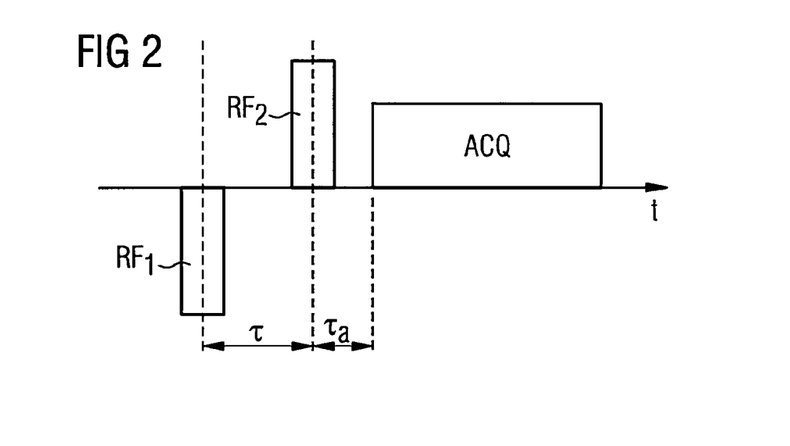
FIG. 2 schematically illustrates a pulse sequence according to a first variant of the method according to the invention.

The excitation and acquisition curve for a first variant of the method according to the invention in the form of a very simplified pulse sequence on only one axis is schematically presented in the pulse diagram in FIG. 2. The first two pulses are the magnetic resonance radio-frequency pulses $RF_1$, $RF_2$. The block shown after this on the time axis symbolizes the acquisition ACQ of the raw data. This acquisition ACQ takes place as a measurement of the FID signal. Since the two magnetic resonance radio-frequency pulses $RF_1$, $RF_2$ are not slice-selective, here the complete spatial coding takes place during the raw data acquisition in that gradient fields are switched in various directions. However, this procedure is known in principle to those skilled in the art and therefore does not need to be explained in detail herein.

In the method shown in FIG. 2, a pulse with the flip angle $-\alpha$ (i.e. with a phase rotated by 180° but the same intensity and length) is sent at the time $t=-\tau$ before the actual excitation pulse (here the second pulse $RF_2$) with the flip angle $\alpha$. Both pulses are small angle pulses that cause a magnetization of approximately 5° and have a pulse length of only approximately 15 µs. The gradients are deactivated during and between the first and second pulse $RF_1$, $RF_2$. The acquisition ACQ of the raw data then begins in a first short interval $\tau_a=70$ µs after the last excitation pulse $RF_2$.

Figure 3:
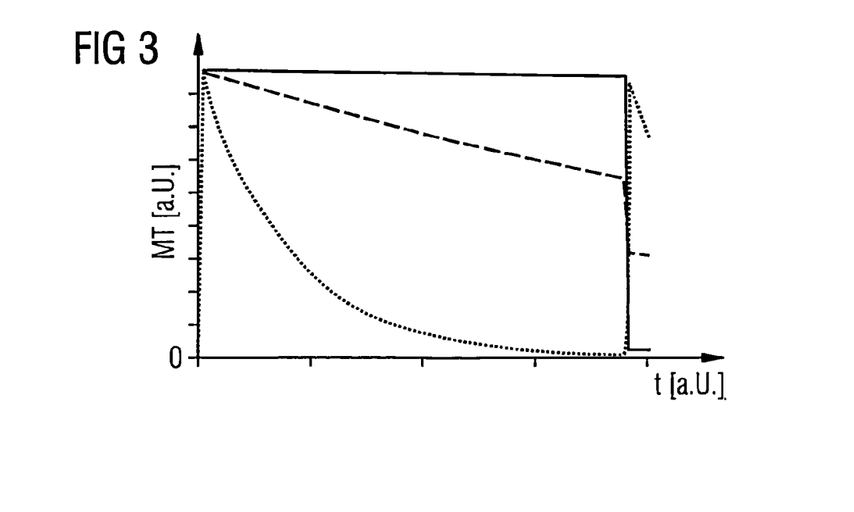
FIG. 3 schematically shows the time decay of the transverse magnetization of various substances depending on their $T_2$ time constant, as well as their re-excitation, given an emission of a pulse sequence according to the first variant of the method according to the invention.

The effect of this magnetic resonance radio-frequency pulse sequence on the magnitude of the transversal magnetization MT is schematically presented in FIG. 3. Analogous to FIG. 1, FIG. 3 again shows the curves for three substances with various $T_2$ time constants. The solid curve corresponds to a substance with long $T_2$, the dashed curve corresponds to a substance with medium $T_2$, and the dotted curve corresponds to a substance with very short $T_2$.

A transverse magnetization that decays again with the individual $T_2$ time constant of the individual substances arises for all substances via the first pulse $RF_1$. After the time interval $\tau$ (which here amounts to between 100 µs and 500 µs, for example), the transversal magnetization of substances with long $T_2$ (solid curve) is rotated to nearly zero by the second magnetic resonance radio-frequency pulse $RF_2$ phase-shifted by nearly 180°, while the substances with short $T_2$ (dotted curve) are again excited to the maximum value.

The transverse magnetization MT immediately after the second magnetic resonance radio-frequency pulse $RF_2$ can be calculated as follows (under the assumption that $T_1 \rightarrow \infty$ applies for the $T_1$ time constant), depending on the interval between the magnetic resonance radio-frequency pulses $RF_1$, $RF_2$ and the $T_2$ time constant for the respective substance:

$$MT(\tau, T_2) = \cos(\alpha_1) \cdot \sin(\alpha_2) + \sin(\alpha_1) \cdot \cos(\alpha_2) \cdot e^{\frac{t}{T_2}} \quad (3)$$

Wherein $\alpha_1$ is the mean magnetization (i.e. the mean flip angle) generated with the first magnetic resonance radio-frequency pulse $RF_1$, and $\alpha_2$ is the mean magnetization generated with the second magnetic resonance radio-frequency pulse RF$_2$. In FIG. 2, for simplicity it has been assumed that the flip angles $\alpha_1$, $\alpha_2$ are identical in both magnetic resonance radio-frequency pulses RF$_1$, RF$_2$, except for the algebraic sign (i.e. identical in terms of absolute value). However, Equation (3) shows that additional contrast possibilities result when the two flip angles $\alpha_1$, $\alpha_2$ are not selected identically in terms of absolute value.

Figure 4:
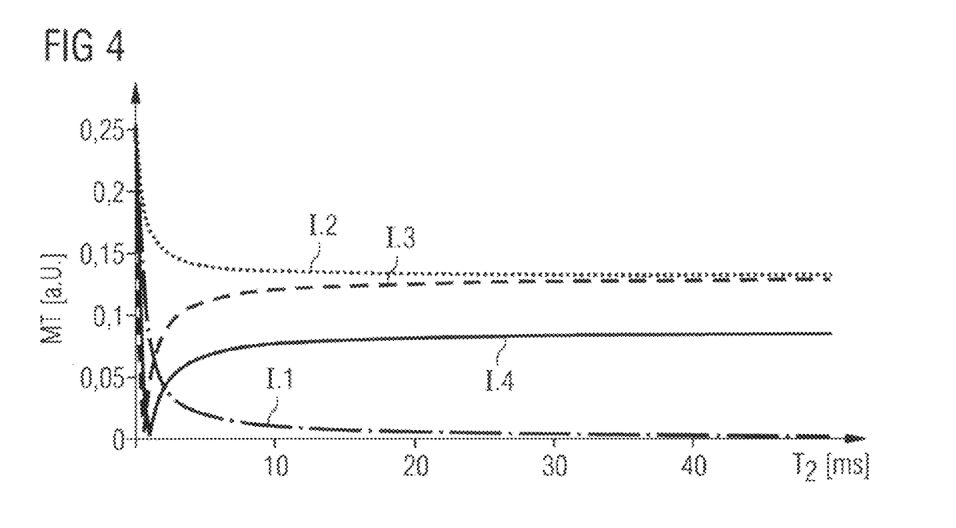
FIG. 4 shows the transverse magnetization immediately after the last magnetic resonance radio-frequency pulse of a pulse sequence according to a first variant of the method according to the invention, depending on the $T_2$ time constant of a substance.

FIG. 4 is referenced in this regard. There the transverse magnetization MT (in arbitrary units a.U.) is plotted according to Equation (3), immediately after the last magnetic resonance radio-frequency pulse RF$_2$ of the pulse sequence over the T$_2$ time constant of the substance (in ms) for various ratios between the two flip angles $\alpha_1$, $\alpha_2$. The interval between the magnetic resonance radio-frequency pulses RF$_1$, RF$_2$ respectively amounts to 0.4 ms in the four graphs presented in FIG. 4.

If the two flip angles $\alpha_1$, $\alpha_2$ are selected to be identical in terms of absolute value (Curve I.1), all substances with a longer T$_2$ time constant (above approximately 5 ms) are thus strongly suppressed. If a pulse frequency is selected in which the flip angle $\alpha_1$ of the first magnetic resonance radio-frequency pulse RF$_1$ is half as large as the flip angle $\alpha_2$ of the second magnetic resonance radio-frequency pulse RF$_2$ ($\alpha_1/\alpha_2=1/2$; Curve I.2), large T$_2$'s are likewise suppressed, but not quite as significantly as in the case of the same flip angle.

In contrast to this, if the flip angle $\alpha_1$ of the first magnetic resonance radio-frequency pulse RF$_1$ is selected to be greater than the flip angle $\alpha_2$ of the second magnetic resonance radio-frequency pulse RF$_2$, substances with very specific short T$_2$ time constants can be suppressed, as the curves I.3 ($\alpha_1/\alpha_2=2$) and I.4 ($\alpha_1/\alpha_2=3/2$) show.

Figure 5:
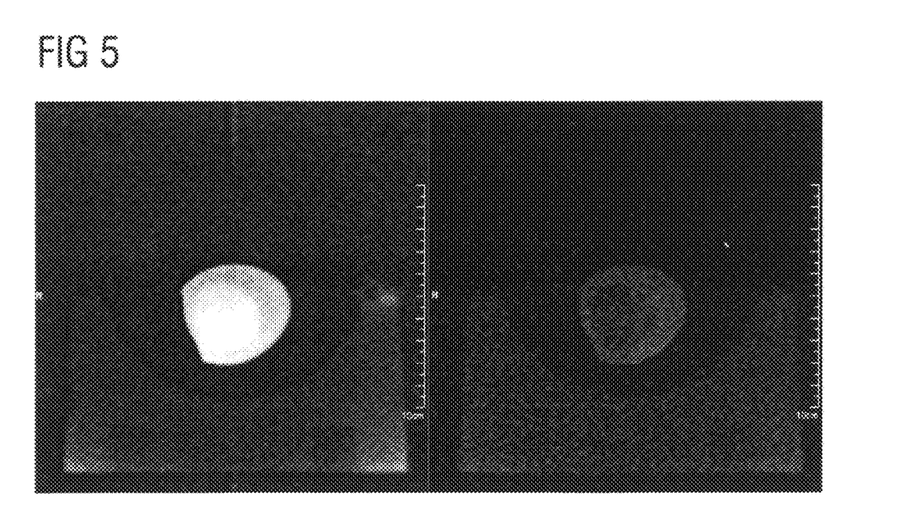
FIG. 5 shows two magnetic resonance images of a phantom (a cooked egg held in a foam block) for comparison of a conventional UEZ sequence (left image) with an acquisition method according to the first variant of the invention (right image).

The advantage of the method according to the invention is immediately apparent using the comparison image shown in FIG. 5. Two magnetic resonance exposures are hereby compared that respectively show as a phantom a cooked egg that is borne in a foam rubber mount. The egg material typically has a long T$_2$ time constant; in contrast to this, the foamed material has a very short T$_2$ time constant. Both acquisition methods are UEZ sequences in which the gradients are deactivated during the pulse. Both images are identically windowed. Shown on the left side is an image of a normal UEZ sequence in which, although substances with short T$_2$ (lower foam) are still visible, the signal of substances with long T$_2$ (cooked egg in the middle) clearly predominates. Given exposures of complicated structures, this can lead to the situation that the substances with short T$_2$ time constant disappear in the image. The right image shows an exposure in which the first variant of the method according to the invention that is described above has been applied. The interval between the two magnetic resonance radio-frequency pulses RF$_1$, RF$_2$ was hereby 0.3 ms. The signal of short T$_2$ substances has remained nearly invariant, while the signal of the ice with a long T$_2$ time constant has been markedly suppressed. This shows that very good T$_2$-weighted magnetic resonance exposures in which the substances with short T$_2$ time constants dominate can be produced with the method according to the invention.

A very fast suppression of substances with long T$_2$ is thus achieved overall with this method. For exposures in which predominantly substances with short T$_2$ time constants should be visible, no second echo is required, whereby a large time savings is achieved in contrast to conventional sequences. A simple change of the suppression is additionally possible by changing the interval $\tau$ between the magnetic resonance radio-frequency pulses RF$_1$, RF$_2$. Moreover, specific contrasts can be markedly increased by changing the flip angles.

Figure 6:
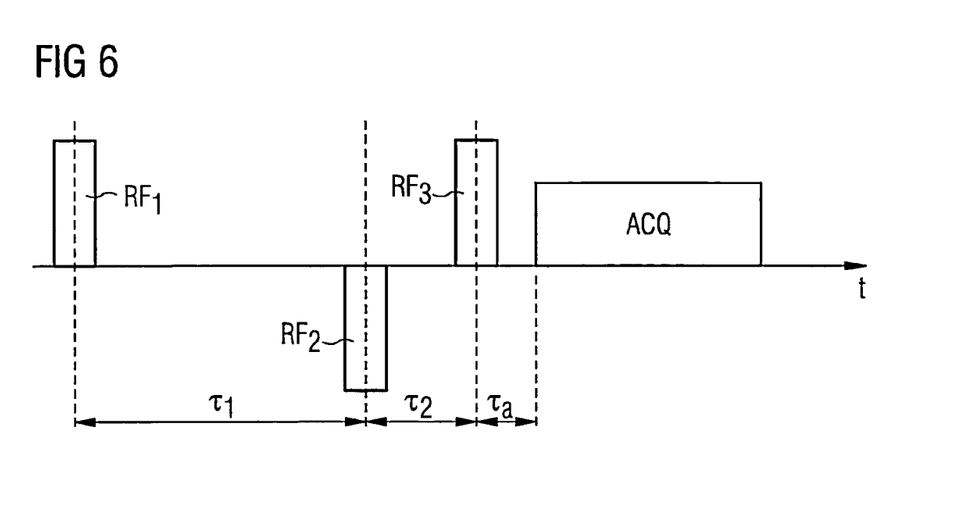
FIG. 6 schematically illustrates a pulse sequence according to a second variant of the method according to the invention.

Analogous to the manner of presentation in FIG. 2, FIG. 6 shows a pulse diagram in which excitation and acquisition curve for the second variant of the method according to the invention is schematically presented.

As in the first variant, two hard, short magnetic resonance radio-frequency pulses RF$_1$, RF$_2$ with phase rotated by 180° relative to one another are also emitted in this method. This pulse sequence differs from the pulse sequence according to the first variant only due to an additional magnetic resonance radio-frequency pulse RF$_3$. This means that one excitation pulse with the flip angle $\alpha$ is initially applied, and then an additional pulse with the flip angle $-\alpha$ with a time interval $\tau_1$ of 2 to 15 ms, for example.

At a very short time after this second magnetic resonance radio-frequency pulse RF$_2$, a third magnetic resonance radio-frequency pulse RF$_3$ is again sent at a time interval $\tau_2$ with the flip angle $\alpha$, i.e. with phase rotated again by 180°. $\tau_1 \gg \tau_2$ advantageously applies. In the concrete case, $\tau_2$ amounts to approximately 500 µs.

All three magnetic resonance radio-frequency pulses RF$_1$, RF$_2$, RF$_3$ here are small angle pulses that cause a magnetization of approximately 5° and have a pulse length of only approximately 15 µs. The gradients are deactivated during and between the pulses RF$_1$, RF$_2$, RF$_3$.

Here as well the acquisition ACQ of the raw data then begins in a very short interval $\tau_a$ of approximately 70 µs after the last excitation pulse RF$_3$. This means that this interval $\tau_a$ lies just below the order of magnitude of the interval $\tau_2$ between the two preceding magnetic resonance radio-frequency pulses RF$_2$, RF$_3$.

Figure 7:
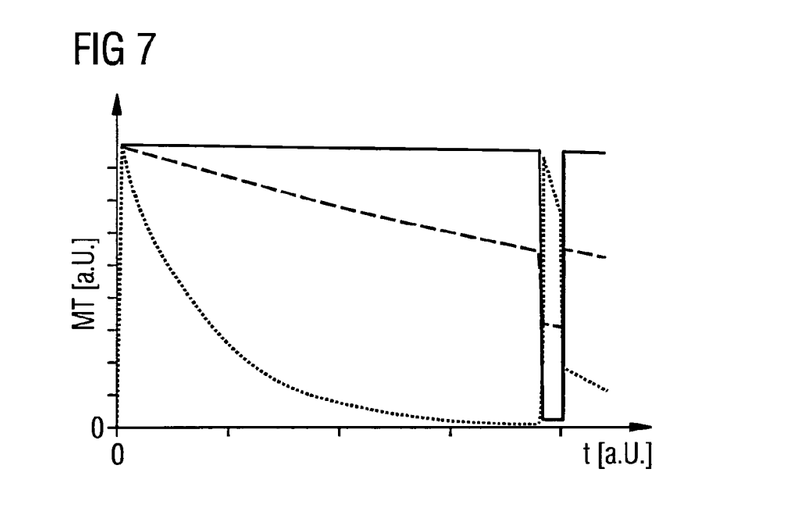
FIG. 7 schematically shows the time decay of the transverse magnetization of various substances depending on their $T_2$ time constant, as well as their re-excitation, given an emission of a pulse sequence according to the second variant of the method according to the invention.

The effect of this magnetic resonance radio-frequency pulse sequence on the absolute value of the transversal magnetization MT is now schematically presented again, analogous to the presentations in FIGS. 1 and 3 (not true to scale with regard to the presentation of the curves in FIG. 3). The solid curve corresponds again to a substance with long T$_2$, the dashed curve corresponds to a substance with medium T$_2$ and the dotted curve corresponds to a substance with very short T$_2$.

A transverse magnetization that decays with the T$_2$ time constant arises due to the first magnetic resonance radio-frequency pulse RF$_1$. The transverse magnetization of substances with long T$_2$ (solid curve) is rotated to nearly zero again by the magnetic resonance radio-frequency pulse RF$_2$ phase-shifted by 180°, while the substances with short T$_2$ time constant (dotted curve) are excited again to the maximum value. If the third magnetic resonance radio-frequency pulse RF$_3$ with identical phase as the first magnetic resonance radio-frequency pulses RF$_1$ follows shortly afterward at the time $\tau_1+\tau_2$, the transversal magnetization of substances with short T$_2$ is rotated again to zero while substances with long T$_2$ again have a transversal magnetization different than zero.

The transverse magnetization MT directly after the last magnetic resonance radio-frequency pulse RF$_3$ can (again under the assumption that $T_1 \to \infty$ applies for the $T_1$ time constant) be calculated as follows for depending on the intervals $\tau_1$, $\tau_2$ between the magnetic resonance radio-frequency pulses RF$_1$, RF$_2$, RF$_3$ and the T$_2$ time constant for the respective substance, analogous to Equation (3):

$$MT(\tau_1, \tau_2, T_2) = \cos(\alpha_1) \cdot \cos(\alpha_2) \cdot \sin(\alpha_3) - \qquad (4)$$
$$\sin(\alpha_1) \cdot \sin(\alpha_2) \cdot \sin(\alpha_3) \cdot e^{-\frac{\tau_1}{T_2}} + \cos(\alpha_1) \cdot \sin(\alpha_2) \cdot \cos(\alpha_3) \cdot e^{-\frac{\tau_2}{T_2}} +$$
$$\sin(\alpha_1) \cdot \cos(\alpha_2) \cdot \cos(\alpha_3) \cdot e^{-\frac{(\tau_1-\tau_2)}{T_2}}$$

Wherein $\alpha_1$ is again the mean magnetization generated with the first magnetic resonance radio-frequency pulse $RF_1$, $\alpha_2$ is the mean magnetization generated with the second magnetic resonance radio-frequency pulse $RF_2$, and $\alpha_3$ is accordingly the mean magnetization generated with the third magnetic resonance radio-frequency pulse $RF_3$.

Figure 8:
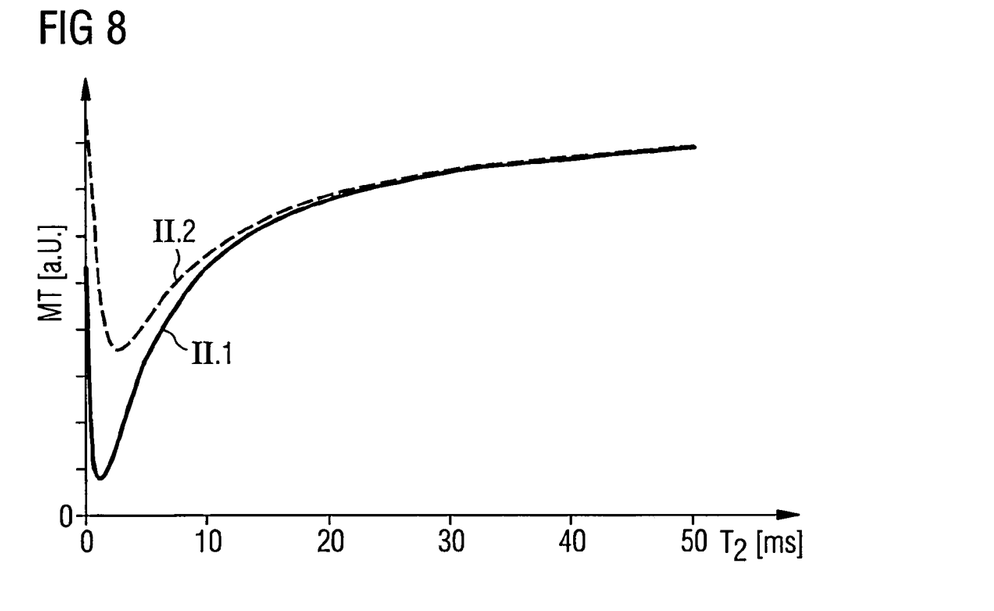
FIG. 8 shows the transverse magnetization immediately after the last magnetic resonance radio-frequency pulse of a pulse sequence according to the second variant of the method according to the invention, depending on the $T_2$ time constant of a substance, for various pulse intervals between the second and third magnetic resonance radio-frequency pulse.

If this transverse magnetization MT (in arbitrary units=a.U.) according to Equation (4) is applied immediately after the last magnetic resonance radio-frequency pulse $RF_2$ of the pulse sequence over the $T_2$ time constant of the substance (in ms), the good suppression of substances with short $T_2$ time constants is registered.

This is shown in FIG. 8 for a pulse sequence with identical flip angles $\alpha_1$, $\alpha_2$, $\alpha_3$ of the three magnetic resonance radio-frequency pulses $RF_1$, $RF_2$, $RF_3$, but for two different interval times $\tau_2$ between the second and third magnetic resonance radio-frequency pulse $RF_2$, $RF_3$. This interval amounts to $\tau_2$=0.1 ms in the curve II.1 and $\tau_2$=1 ms in the curve II.2. Both curves have been calculated for the identical interval $\tau_1$=5 ms between the first and second magnetic resonance radio-frequency pulse $RF_1$, $RF_2$. This shows that the strength of the suppression of the substances with long $T_2$ time constant can be adjusted simply via the selection of the interval $\tau_2$ between the second and third magnetic resonance radio-frequency pulse $RF_2$, $RF_3$.

For simplicity, in FIGS. 6 through 8 it is again assumed that the flip angles $\alpha_1$, $\alpha_2$, $\alpha_3$ are of identical absolute value in all magnetic resonance radio-frequency pulses $RF_1$, $RF_2$, $RF_3$. However, here as well—as shown in Equation (4)—additional contrast possibilities result again when the flip angles $\alpha_1$, $\alpha_2$, $\alpha_3$ are not selected identically in terms of absolute value.

Figure 9:
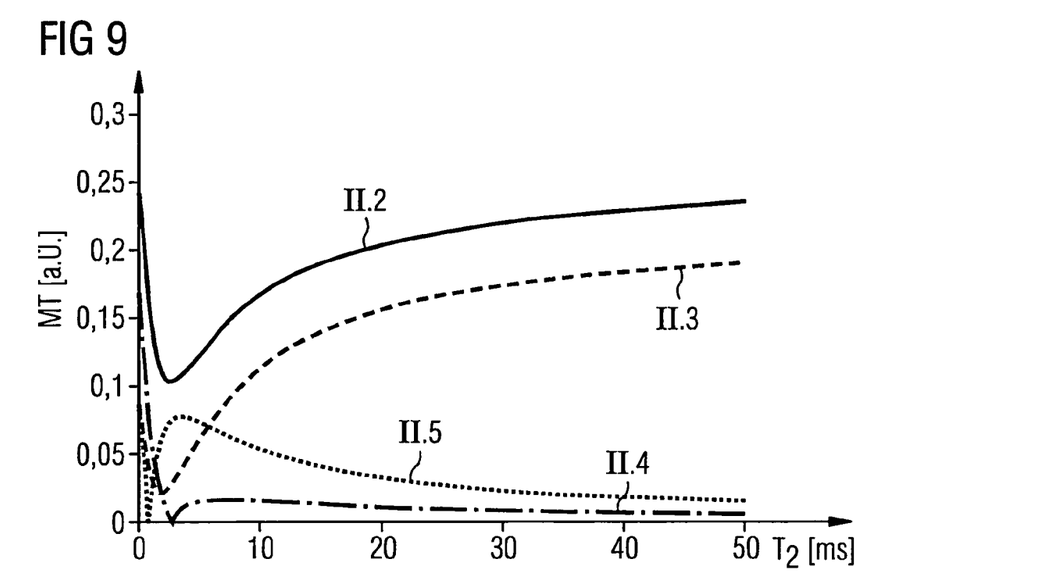
FIG. 9 shows the transverse magnetization immediately after the last magnetic resonance radio-frequency pulse of a pulse sequence according to the second variant of the method according to the invention, depending on the $T_2$ time constant of a substance, for various flip angle combinations of the magnetic resonance radio-frequency pulses.

FIG. 9 is referenced in this regard. As in FIG. 8, there the transverse magnetization MT is plotted over the $T_2$ time constant of the substance. The different curves here show the different suppression for various ratios between the flip angles $\alpha_1$, $\alpha_2$, $\alpha_3$. In the graphs shown in FIG. 9, the interval $\tau_1$ between the first two magnetic resonance radio-frequency pulses $RF_1$, $RF_2$ respectively amount to 10 ms, and the interval $\tau_2$ between the last two magnetic resonance radio-frequency pulses $RF_2$, $RF_3$ respectively amounts to 1 ms in the four graphs shown in FIG. 9.

The individual curves have been calculated with the following flip angle relationships:

Curve II.2: $\alpha_1 = \alpha_2 = \alpha_3$

Curve II.3: $\alpha_1 = 2\alpha_2 = 3\alpha_3$

Curve II.4: $3\alpha_1 = \alpha_2 = 2\alpha_3$

Curve II.5: $2\alpha_1 = 3\alpha_2 = \alpha_3$

These graphs clearly show that the method offers a series of variation possibilities in order to suppress relatively targeted substances with defined $T_2$ time constants.

Figure 10:
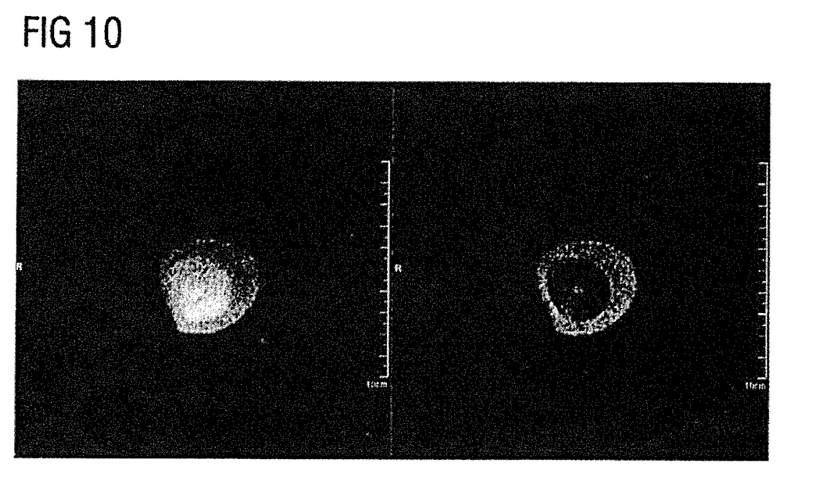
FIG. 10 shows two magnetic resonance images of a phantom (a cooked egg held in a foam block) for comparison of a conventional UEZ sequence (left image) with an acquisition method according to the second variant of the invention (right image).

For example, the advantage of the method according to the invention is also apparent using the comparison images shown in FIG. 10. Here again two magnetic resonance exposures are compared that respectively show a phantom a cooked egg borne in a foam rubber mount. Here as well, both acquisition methods are UEZ sequences in which the gradients are deactivated during the pulse. Both images are identically windowed. An image of a normal UEZ sequence is shown on the left side, in which UEZ sequence both substances with short $T_2$ (lower foam substance) and long $T_2$ (egg in the middle) are visible. The right image shows an exposure in which the second variant of the method according to the invention that is described above has been applied. The interval $\tau_1$ between the two magnetic resonance radio-frequency pulses $RF_1$, $RF_2$ hereby amounted to 5 ms, and the interval $\tau_2$ between the two magnetic resonance radio-frequency pulses $RF_2$, $RF_3$ was 0.1 ms. The signal of substances with short $T_2$ time constant (foam substance) has disappeared, a marked $T_2$ contrast is perceptible in the egg with the long $T_2$ time constant. A very fast and good suppression of substances with short $T_2$ is thus achieved with this method.

An additional advantage of the use of a sequence with ultrashort echo times to suppress substances with short $T_2$ time constants also is that substances with ultrashort $T_2$ time constant can be maintained in the image via suitable selection of the pulse intervals $\tau_1$, $\tau_2$, and only substances with medium $T_2$ time constants are suppressed. Another important point is that advantages of UEZ sequences such as low tendency to susceptibility artifacts are maintained since, as before, a measurement takes place before the FID. In contrast to the conventional sequences, a time savings is achieved in this variant as well.

Figure 11:
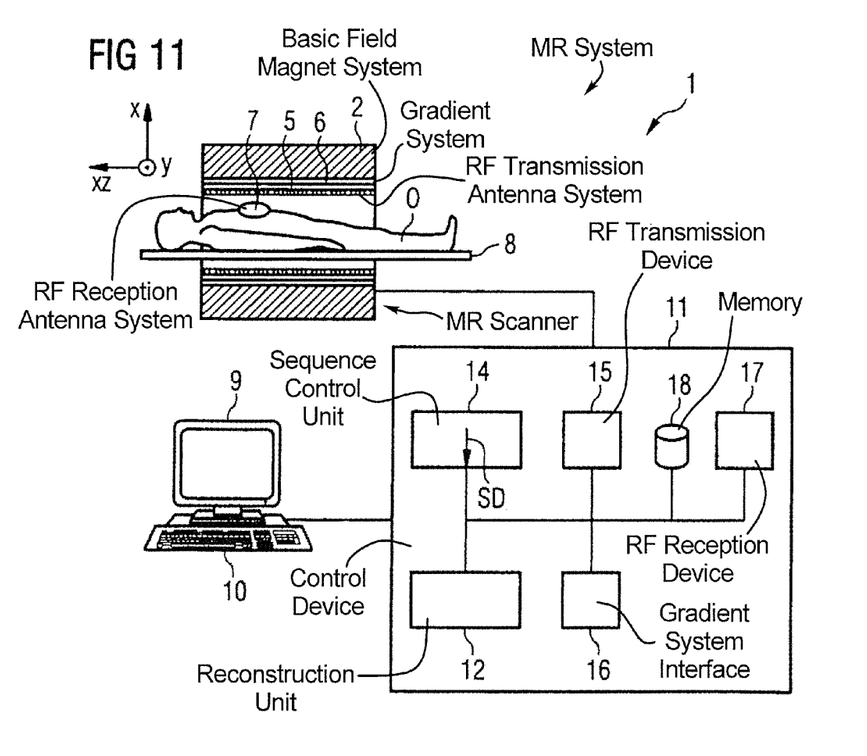
FIG. 11 schematically illustrates a magnetic resonance system according to an exemplary embodiment of the invention.

Finally, a magnetic resonance system 1 according to the invention (abbreviated as "MR system" in the following) with which the methods according to the invention can be implemented is shown with significant simplification in FIG. 1. On the one hand, it comprises the actual magnetic resonance scanner 2 with an examination space 3 or, respectively, patient tunnel extending in the z-direction, into which examination space 3 a patient or test subject in whose body the examination subject O (a specific organ, for example) is located can be driven on a bed 8.

The magnetic resonance scanner 2 is equipped in a typical manner with a basic field magnet system 4, a gradient system 6, and an RF transmission antenna system 5 and an RF reception antenna system 7. In the shown exemplary embodiment, the RF transmission antenna system 5 is a whole-body coil permanently installed in the magnetic resonance scanner 2, in contrast to which the RF reception antenna system 7 includes local coils to be arranged on the patient or test subject (symbolized by only a single local coil in FIG. 1). However, in principle the whole-body coil can also be used as an RF reception antenna system and the local coils can be used as an RF transmission antenna system, insofar as these coils can respectively be switched into different operating modes.

The MR system 1 furthermore has a central control device 11 that is used to control the MR system 1. This central control device 11 comprises a sequence control unit 14 for pulse sequence control. With this the sequence of radio-frequency pulses (RF pulses) and gradient pulses is controlled depending on a selected imaging sequence. For example, such an imaging sequence can be provided within a measurement or control protocol. In the present case, the sequence control unit 14 is designed so that a pulse sequence can be implemented according to one of the methods according to the invention.

To radiate the individual RF pulses, the central control device 11 has a radio-frequency transmission device 15 that generates and amplifies the RF pulses and feeds them into the RF transmission antenna system via a suitable interface (not shown in detail). To control the gradient coils of the gradient system 6, the control device 11 has a gradient system interface 16. The sequence control unit 15 communicates in a suitable manner (for example via emission of sequence control data SD) with the radio-frequency transmission device 15 and the gradient system interface 16 to emit the pulse sequences. The control device 11 moreover has a radio-frequency reception device 17 (likewise communicating with the sequence control unit 14 in a suitable manner) in order to acquire in a coordinated manner magnetic resonance signals (i.e. raw data) received by the RF transmission antenna system 7.

A reconstruction unit 12 accepts the acquired raw data and reconstructs the $T_2$-weighted magnetic resonance exposures from these in a typical manner. For example, these can be stored in a memory 18 or be output to a user.

An operation of the central control device 13 can take place via a terminal with an input unit 10 and a display unit 9 via which the entire MR system 1 can thus also be operated by an operator. MR images can also be displayed on the display unit 9, and measurements can be planned and started by means of the input unit 10, possibly in combination with the display unit 9.

The MR system 1 according to the invention, and in particular the control device 11, can have a number of additional components that are not shown in detail here but that are typically present in such apparatuses, for example a network interface in order to connect the entire system with a network and to be able to exchange raw data and/or image data, but also additional data (for example patient-relevant data or control protocols).

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to operate a magnetic resonance system to generate a magnetic resonance image of an examination subject, comprising:
    operating a magnetic resonance data acquisition unit, with an examination subject therein, to radiate a first radio frequency (RE) pulse into a volume region of the examination subject, said first RF pulse having a pulse length of at most 50 µs;
    operating said magnetic resonance data acquisition unit to radiate at least one second RF pulse into said volume region of said examination subject at a predetermined time interval immediately following radiation of said first RF pulse, said at least one second RF pulse having a phase that is rotated by substantially 180° with respect to said first RF pulse, and having a pulse length of at most 50 µs;
    operating said magnetic resonance data acquisition unit to detect magnetic resonance signals emanating from said volume region of the examination subject resulting from excitation of nuclear spins in said volume region of said examination subject at least by said first RF pulse; and
    in a computer, processing raw data representing the detected magnetic resonance signals to generate image data comprising a magnetic resonance image of said volume region of said examination subject, and making said image data available at an output of said computer in a data file.

2. A method as claimed in claim 1 comprising radiating said second RF pulse as an excitation pulse that also excites said nuclear spins in said volume region of said examination subject, and operating said magnetic resonance data acquisition unit to detect said magnetic resonance signals within a short time interval immediately after radiating said second RF pulse.

3. A method as claimed in claim 1 comprising operating said magnetic resonance data acquisition unit to radiate a third radio frequency pulse in said volume region of said examination subject within a short time interval immediately following said second RF pulse, said third RF pulse having a pulse length of at most 50 µs and having a phase that is rotated by substantially 180° with respect to said second RF pulse, and operating said magnetic resonance data acquisition unit to detect said magnetic resonance signals within a short time interval immediately following radiation of said third RF pulse.

4. A method as claimed in claim 3 wherein at least one of said first RF pulse, said second RF pulse and said third RF pulse is a small angle pulse that produces a magnetization of said nuclear spins with a mean flip angle of at most 15°.

5. A method as claimed in claim 3 wherein at least one of said first RF pulse, said second RF pulse and said third RF pulse has a pulse length of at most 30 µs.

6. A method as claimed in claim 3 comprising operating said magnetic resonance data acquisition unit to radiate said first, second and third RF pulses without simultaneous emission of gradient pulses.

7. A method as claimed in claim 1 comprising operating said magnetic resonance data acquisition unit to generate a same average flip angle with each of said first, second and third radio frequency pulses.

8. A method as claimed in claim 3 comprising operating said magnetic resonance data acquisition unit to generate different average flip angles respectively with at least two of said first, second and third RF pulses.

9. A method as claimed in claim 3 comprising operating said magnetic resonance data acquisition unit to radiate said second and third RF pulses with an interval between of at most 1,000 µs.

10. A method as claimed in claim 3 comprising operating said magnetic resonance data acquisition unit with an interval between said third RF pulse and beginning of detection of said magnetic resonance signals of at most 200 µs.

11. A method as claimed in claim 1 comprising operating said magnetic resonance data acquisition unit to radiate at least one of said first RF pulse and said second RF pulse as a small angle pulse that produces a magnetization of said nuclear spins with an average flip angle of at most 15°.

12. A method as claimed in claim 1 wherein at least one of said first RF pulse and said second RF pulse has a pulse length of at most 30 µs.

13. A method as claimed in claim 1 comprising operating said magnetic resonance data acquisition unit to radiate said first and second RF pulses without simultaneous emission of gradient pulses.

14. A method as claimed in claim 1 comprising operating said magnetic resonance data acquisition unit to radiate each of said first and second RF pulses to produce a same average flip angle of magnetization of said nuclear spins in said volume region.

15. A method as claimed in claim 1 comprising operating said magnetic resonance data acquisition unit to radiate each of said first and second RF pulses to produce a different average flip angle of magnetization of said nuclear spins in said volume region.

16. A method as claimed in claim 1 comprising operating said magnetic resonance data acquisition unit to radiate said first and second RF pulses with an interval there between of at most 1,000 µs.

17. A method as claimed in claim 1 comprising operating said magnetic resonance data acquisition unit with an interval between radiating said second RF pulse and beginning detection of said magnetic resonance signals of at most 200 µs.

18. A control device for a magnetic resonance system, said magnetic resonance system comprising a magnetic resonance data acquisition unit comprising at least one radio frequency (RF) radiator and at least one RF detector, said control device comprising:

a transmission unit configured to operate a magnetic resonance data acquisition unit, with an examination subject therein, to radiate a first radio frequency (RF) pulse into a volume region of the examination subject, said first RF pulse having a pulse length of at most 50 µs;

said transmission unit being configured to operate said magnetic resonance data acquisition unit to radiate at least one second RF pulse into said volume region of said examination subject at a predetermined time interval immediately following radiation of said first RF pulse, said at least one second RE pulse having a phase that is rotated by substantially 180° with respect to said first RF pulse, and having a pulse length of at most 50 µs;

a reception unit configured to operate said magnetic resonance data acquisition unit to detect magnetic resonance signals emanating from said volume region of the examination subject resulting from excitation of nuclear spins in said volume region of said examination subject at least by said first RF pulse; and a computer configured to process raw data representing the detected magnetic resonance signals to generate image data comprising a magnetic resonance image of said volume region of said examination subject, and to make said image data available at an output of said computer in a data file.

19. A magnetic resonance system comprising:

a magnetic resonance data acquisition unit comprising at least one radio frequency (RF) radiator and at least one RF detector, a gradient coil system that generates magnetic field gradients, and a basic field magnet that generates a static basic magnetic field in an examination volume configured to receive a volume region of an examination subject therein;

a control unit configured to operate said magnetic resonance data acquisition unit, with an examination subject therein, to radiate a first radio frequency (RF) pulse into a volume region of the examination subject, said first RF pulse having a pulse length of at most 50 µs;

said control unit being configured to operate said magnetic resonance data acquisition unit to radiate at least one second RF pulse into said volume region of said examination subject at a predetermined time interval immediately following radiation of said first RF pulse, said at least one second RF pulse having a phase that is rotated by substantially 180° with respect to said first RF pulse, and having a pulse length of at most 50 µs;

said control unit being configured to operate said magnetic resonance data acquisition unit to detect magnetic resonance signals emanating from said volume region of the examination subject resulting from excitation of nuclear spins in said volume region of said examination subject at least by said first RF pulse; and a computer configured to process raw data representing the detected magnetic resonance signals to generate image data comprising a magnetic resonance image of said volume region of said examination subject, and to make said image data available at an output of said computer in a data file.

* * * * *